(12) United States Patent
Hannu et al.

(10) Patent No.: US 6,883,035 B2
(45) Date of Patent: Apr. 19, 2005

(54) SYSTEM AND METHOD FOR COMMUNICATING WITH TEMPORARY COMPRESSION TABLES

(75) Inventors: Hans Hannu, Lulea (SE); Jan Christoffersson, Lulea (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 686 days.

(21) Appl. No.: 09/814,268

(22) Filed: Mar. 21, 2001

(65) Prior Publication Data

US 2002/0058501 A1 May 16, 2002

Related U.S. Application Data

(60) Provisional application No. 60/249,643, filed on Nov. 16, 2000.

(51) Int. Cl.$^7$ .................................. G06F 13/00
(52) U.S. Cl. ................... 709/247; 709/217; 709/238; 709/250
(58) Field of Search .................. 709/217, 238, 709/247, 250, 203, 219, 237, 246

(56) References Cited

U.S. PATENT DOCUMENTS

| | | | | |
|---|---|---|---|---|
| 5,293,379 A | * | 3/1994 | Carr ........................... | 370/474 |
| 5,530,645 A | | 6/1996 | Chu ........................... | 364/419.13 |
| 5,537,551 A | * | 7/1996 | Denenberg et al. ......... | 709/247 |
| 5,889,818 A | * | 3/1999 | Spiess ........................ | 375/240 |
| 6,067,381 A | | 5/2000 | Benayoun et al. .......... | 382/232 |
| 6,082,776 A | * | 7/2000 | Feinberg ...................... | 283/72 |
| 6,145,069 A | * | 11/2000 | Dye ............................ | 711/170 |
| 6,222,942 B1 | * | 4/2001 | Martin ........................ | 382/232 |

FOREIGN PATENT DOCUMENTS

EP        0 788 239 A2     8/1997

OTHER PUBLICATIONS

Hans Hannu, et al.; "Robust Generic Message Size Reduction (ROGER)"; Network Working Troup, Internet–Draft; Feb. 23, 2001.

PCT; International Serach Report for PCT/SE01/02341; May 2, 2002.

Deutsch, P. "Deflate Compressed Data Format Specification version 1.3." IETF RFC 1951. (1996). pp. 1–17.

Bormann C., et al. (2000) Robust Header Compression (ROHC). Internet Draft (work in Progress), Oct. 2000, <draft–ietf–rohc–rpt–05.txt>pp. 1–156.

* cited by examiner

*Primary Examiner*—Viet D. Vu

(57) ABSTRACT

A method, system, and apparatus for increasing the efficiency and robustness of the compression of messages using a communication protocol for communication between entities over bandwidth-limited communication links. In one aspect of the present invention, a dictionary compression method is used to compress and decompress messages between communication entities. Each communication entity includes a static dictionary, a dynamic dictionary, a Temporary Receiver Dictionary, and a Temporary Sender Table. During compression of messages, a compressor in each entity uses the static dictionary, the dynamic dictionary, and the Temporary Receiver Dictionary as compression dictionaries. During decompression of messages, a decompressor in each entity uses the static dictionary, the dynamic dictionary, and the Temporary Sender Table as decompression dictionaries.

11 Claims, 4 Drawing Sheets

SYSTEM AND METHOD FOR COMMUNICATING WITH TEMPORARY COMPRESSION TABLES

CROSS-REFERENCE TO RELATED APPLICATIONS

This patent application is related to and claims priority from U.S. Patent Application No. 60/249,643, filed Nov. 16, 2000; U.S. patent application Ser. No. 09/814,406, filed concurrently herewith, entitled "Static Information Knowledge Used With Binary Compression Method"; U.S. patent application Ser. No. 09/814,407, filed concurrently herewith, entitled "Communication System and Method Utilizing Request-Reply Communication Patterns For Data Compression"; and and U.S. patent application Ser. No. 09/814,434, filed concurrently herewith, entitled "Communication System and Method For Shared Context Compression".

BACKGROUND OF THE INVENTION

1. Technical Field of the Invention

The present invention relates to the compression of messages in communications using data protocols, e.g. Internet protocols.

2. Background and Objects of the Present Invention

Two communication technologies that have become widely used by the general public in recent years are cellular telephony and the Internet. Some of the benefits that have been provided by cellular telephony have been freedom of mobility and accessability with reasonable service quality despite a user's location. Until recently the main service provided by cellular telephony has been speech. In contrast, the Internet, while offering flexibility for different types of usage, has been mainly focused on fixed connections and large terminals. However, the experienced quality of some services, such as Internet telephony, has generally been regarded as quite low.

A number of Internet Protocols (IPs) have been developed to provide for communication across the Internet and other networks. An example of such an Internet protocol is the Session Initiation Protocol (SIP), which is an application layer protocol for establishing, modifying, and terminating multimedia sessions or calls. These sessions may include Internet multimedia conferences, Internet telephony, and similar applications. As is understood in this art, SIP can be used over either the Transmission Control Protocol (TCP) or the User Datagram Protocol (UDP).

Another example of an Internet Protocol is the Real Time Streaming Protocol (RTSP), which is an application level protocol for control of the delivery of data with real-time properties, such as audio and video data. RTSP may also be used with UDP, TCP, or other protocols as a transport protocol. Still another example of an Internet Protocol is the Session Description Protocol (SDP), which is used to advertise multimedia conferences and communicate conference addresses and conference tool-specific information. SDP is also used for general real-time multimedia session description purposes. SDP is carried in the message body of SIP and RTSP messages. SIP, RTSP, and SDP are all ASCII text based using the ISO 10646 character set in UTF-8 encoding.

Due to new technological developments, Internet and cellular telephony technologies are beginning to merge. Future cellular devices will contain an Internet Protocol (IP) stack and support voice over IP, as well as web-browsing, e-mail, and other desirable services. In an "all-IP" or "IP all the way" implementation, Internet Protocols are used end-to-end in the communication system. In a cellular system this may include IP over cellular links and radio hops. Internet Protocols may be used for all types of traffic including user data, such as voice or streaming data, and control data, such as SIP or RTSP data. Such a merging of technologies provides for the flexibility advantages of IP along with the mobility advantages of cellular technology.

As is understood in the art, the SIP, RTSP, and SDP protocols share similar characteristics which have implications in their use with cellular radio access. One of these similarities is the general request and reply nature of the protocols. Typically, when a sender sends a request, the sender stays idle until a response is received. Another similarity, as previously described, is that SIP, RTSP, and SDP are all ASCII text based using the ISO 10646 character set with UTF-8 encoding. As a result, information is usually represented using a greater number of bits than would be required in a binary representation of the same information. Still another characteristic that is shared by the protocols is that they are generally large in size in order to provide the necessary information to session participants.

A disadvantage with IP is the relatively large overhead the IP protocol suite introduces due to large headers and text-based signaling protocols. It is very important in cellular systems to use the scarce radio resources in an efficient manner. In cellular systems it is important to support a sufficient number of users per cell, otherwise implementation and operation costs will be prohibitive. Frequency spectrum, and thus bandwidth, is a costly resource in cellular links and should be used efficiently to maximize system resources.

In the UMTS and EDGE mobile communication systems and in future releases of second generation systems, such as GSM and IS-95, much of the signaling traffic will be performed by using Internet protocols. However as discussed, most of the Internet protocols have been developed for fixed, relatively broadband connections. When access occurs over narrow band cellular links, compression of the protocol messages is needed to meet quality of service requirements, such as set-up time and delay. Typically, compression over the entire communication path is not needed. However, compression of traffic over the radio link, such as from a wireless user terminal to a core network, is greatly desirable.

Standard binary compression methods, such as Lempel-Ziv and Huffman coding, are very general in the sense that they do not utilize any explicit knowledge of the structure of the data to be compressed. The use of such methods on Internet data protocols, e.g., SIP and RTSP, present difficulties for the efficient compression of communication messages. Standard binary compression methods available today are typically designed for large data files. As a consequence, use of such methods for the compression of small messages or messages with few repeated strings results in compression performance generally regarded as very poor. In fact, if the message to be compressed is small and/or contains few repeated strings, the use of some standard compression methods may result in a compressed packet which is actually larger than the original uncompressed packet, thereby achieving a counterproductive result.

One method for implementing a binary compression scheme is the use of a binary code tree. In a binary code tree, symbols or strings which are to be compressed are represented in a tree structure by a variable number of bits such that each symbol is uniquely decodable. Typically, symbols with higher probabilities of occurrence in the input data are represented by a shorter number of bits than those which have lower probabilities of occurrence. In the construction of the binary code tree, individual symbols are laid out as a string of leaf nodes connected to a binary tree. Symbols with higher probabilities of occurrence are represented as shorter branches of the tree resulting in a fewer number of bits being required to represent them. Conversely, symbols with lower probabilities of occurrence are represented as longer branches of the tree requiring a greater number of representation bits. When a string of input data matches a symbol in the binary code tree of the compressor, the code of the symbol is transmitted instead of the symbol itself resulting in data compression. A decompressor receiving the code reconstructs the original symbol or string using an identical binary code tree.

One example of a binary code tree compression scheme is that of a Huffman coding compression scheme. Huffman compression is a general compression method intended primarily for compression of ASCII files. Characters occurring frequently in the files are replaced by shorter codes, i.e. codes with less than the 8 bits used by the ASCII code. Huffman compression can be successful in files where relatively few characters are used in which the file to be compressed is relatively large.

Another method for the compression of data is the use of dictionary-based compression techniques. In general, a dictionary compression scheme uses a data structure known as a dictionary to store strings of symbols which are found in the input data. The scheme reads in input data and looks for strings of symbols which match those in the dictionary. If a string match is found, a pointer or index to the location of that string in the dictionary is output and transmitted instead of the string itself. If the index is smaller than the string it replaces, compression will occur. A decompressor contains a representation of the compressor dictionary, so that the original string may be reproduced from the received index. An example of a dictionary compression method is the Lempel-Ziv (LZ77) algorithm. This algorithm operates by replacing character strings which have previously occurred in the file by references to the previous occurrence. This method is, of course, particularly successful in files where repeated strings are common.

Dictionary compression schemes may be generally categorized as either static or dynamic. A static dictionary is a predefined dictionary which is constructed before compression occurs and which does not change during the compression process. Static dictionaries are typically either stored in the compressor and decompressor prior to use, or transmitted and stored in memory prior to the start of compression operations.

A dynamic or adaptive dictionary scheme, on the other hand, allows the contents of the dictionary to change as compression occurs. In general a dynamic dictionary scheme starts out with either no dictionary or a default, predefined dictionary and adds new strings to the dictionary during the compression process. If a string of input data is not found in the dictionary, the string is added to the dictionary in a new position and assigned a new index value. The new string is transmitted to the decompressor so that it can be added to the dictionary of the decompressor. The position of the new string does not have to be transmitted, as the decompressor will recognize that a new string has been received, and will add the string to the decompressor dictionary in the same position in which it was added in the compressor dictionary. In this way, a future occurrence of the string in the input data can be compressed using the updated dictionary. As a result, the dictionaries at the compressor and decompressor are constructed and updated dynamically as compression occurs.

A general criteria for successful compression using the aforementioned binary compression algorithms is that the file to be compressed is reasonably large. The codes for Huffman compression must not be too large compared to the file which is being compressed. For standard Lempel-Ziv compression, the file to be compressed must be large enough to have many repeated strings to achieve efficient compression. The messages produced by the aforementioned protocols are mostly a few hundred bytes and not large enough to allow efficient compression with the aforementioned algorithms on a message by message basis.

Thus, a need exists in the art for a system, methodology and apparatus to increase the efficiency of dictionary compression methods so that they may be used to compress messages which are transmitted between communication entities over bandwidth-limited communication links using communication protocols. The updating of the compression and decompression dictionaries should be performed as quickly as possible since the size of the dictionary has a large effect on the compression efficiency. In addition, the methodology should be robust so that lost packets do not make compression and decompression of the subsequent messages impossible.

SUMMARY OF THE INVENTION

The present invention is directed to a method, system, and apparatus for increasing the efficiency and robustness of the compression of messages using a communication protocol for communication between entities over bandwidth-limited communication links. In one aspect of the present invention, a dictionary compression method is used to compress and decompress messages between communication entities. Each communication entity includes a static dictionary, a dynamic dictionary, a Temporary Receiver Dictionary, and a Temporary Sender Table. During compression of messages, a compressor in each entity uses the static dictionary, the dynamic dictionary, and the Temporary Receiver Dictionary as compression dictionaries. During decompression of messages, a decompressor in each entity uses the static dictionary, the dynamic dictionary, and the Temporary Sender Table as decompression dictionaries.

BRIEF DESCRIPTION OF THE DRAWINGS

A more complete understanding of the system, method and apparatus of the present invention may be had by reference to the following Detailed Description when taken in conjunction with the accompanying Drawings wherein.

DETAILED DESCRIPTION OF THE PRESENTLY PREFERRED EXEMPLARY EMBODIMENTS

The present invention will now be described more fully hereinafter with reference to the accompanying Drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
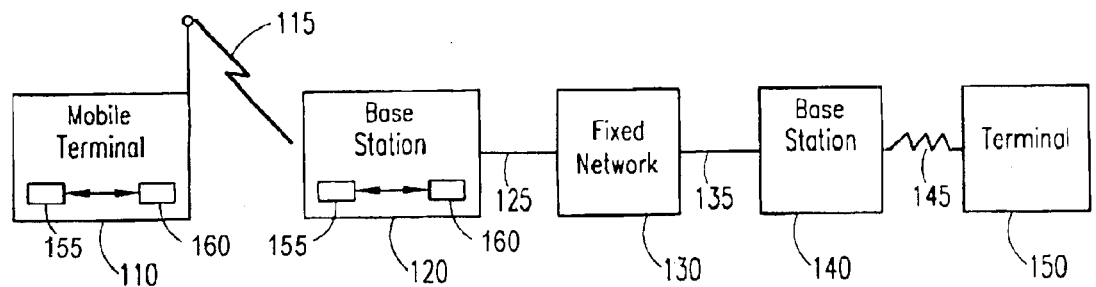
FIG. 1 illustrates an exemplary system for communication in accordance with the present invention.

FIG. 1 illustrates an exemplary system for communication in accordance with the present invention. A mobile terminal 110 is in communication with a base station 120 using communication protocols over a communication link 115, e.g. a wireless link. The base station 120 is in communication with a fixed network 130, such as a PSTN, via a communication link 125. Fixed network 130 is in communication with a base station 140 via a communication link 135. Base station 140 is in communication with a terminal 150, which may be a mobile terminal or a fixed terminal, using a communication link 145.

According to an embodiment of the present invention, the mobile terminal 110 communicates with the base station 120 using compressed messages over the communication link 115. Similarly, base station 140 may communicate with terminal 150 using compressed communication messages. It should be understood that components in the system of FIG. 1, such as mobile terminal 110 and base station 140, may include a memory 160 and processor 155 used for storing and executing software instructions which implement compression and decompression algorithms. It should also be understood that the present invention may be used in other communication systems, such as a cellular network, that use communication protocols over links in which compression is desired.

Figure 2:
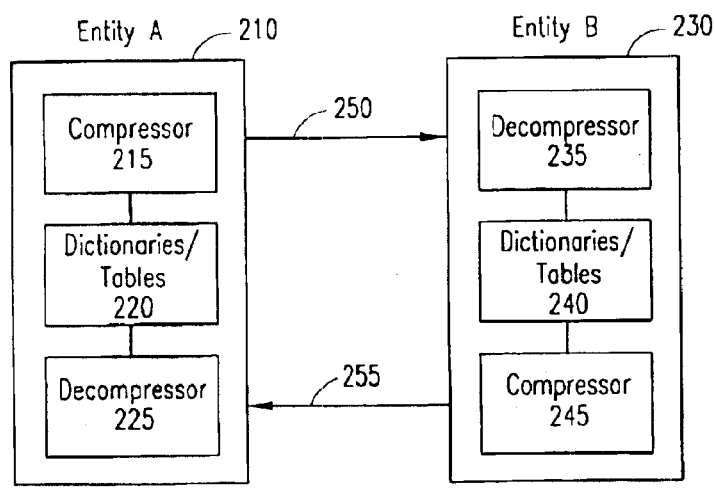
FIG. 2 illustrates an exemplary embodiment in accordance with the present invention.

FIG. 2 illustrates an exemplary embodiment in accordance with the present invention. In this embodiment an entity A (210) communicates with an entity B (230) using communication links (250, 255) with a communication protocol in which a binary data compression method, such as a dictionary method, is preferably used. As illustrated in FIG. 2, entity A (210) includes a compressor 215 for compressing data to be transmitted to entity B (230) over communication link 250, and a decompressor 225 for decompressing data received from entity B (230) over communication link 255. Entity A (210) also contains a number of dictionaries/tables 220, which are associated with the compressor 215 and decompressor 225. It should be understood that the compressor and/or decompressor may be implemented using a processor and associated memory having stored therein instructions for a compression/decompression algorithm(s). It should also be understood that the communication entities may comprise a number of communication devices. For example, entity A may comprise a mobile terminal, and entity B may comprise a base station.

During operation, the compressor 215 and decompressor 225 use the dictionaries/tables 220 for the compression and decompression of messages. As further illustrated in FIG. 2, entity B (230) contains a decompressor 235 for decompressing data received from communication link 250 and a compressor 245 for compressing data to be transmitted over communication link 255. Entity B (230) also contains a number of dictionaries/tables 240 associated with the decompressor 235 and compressor 245. As discussed in more detail hereinafter, during operation, the decompressor 235 and compressor 245 use the dictionaries/tables 240 for the compression and decompression of communication messages.

Figure 3:
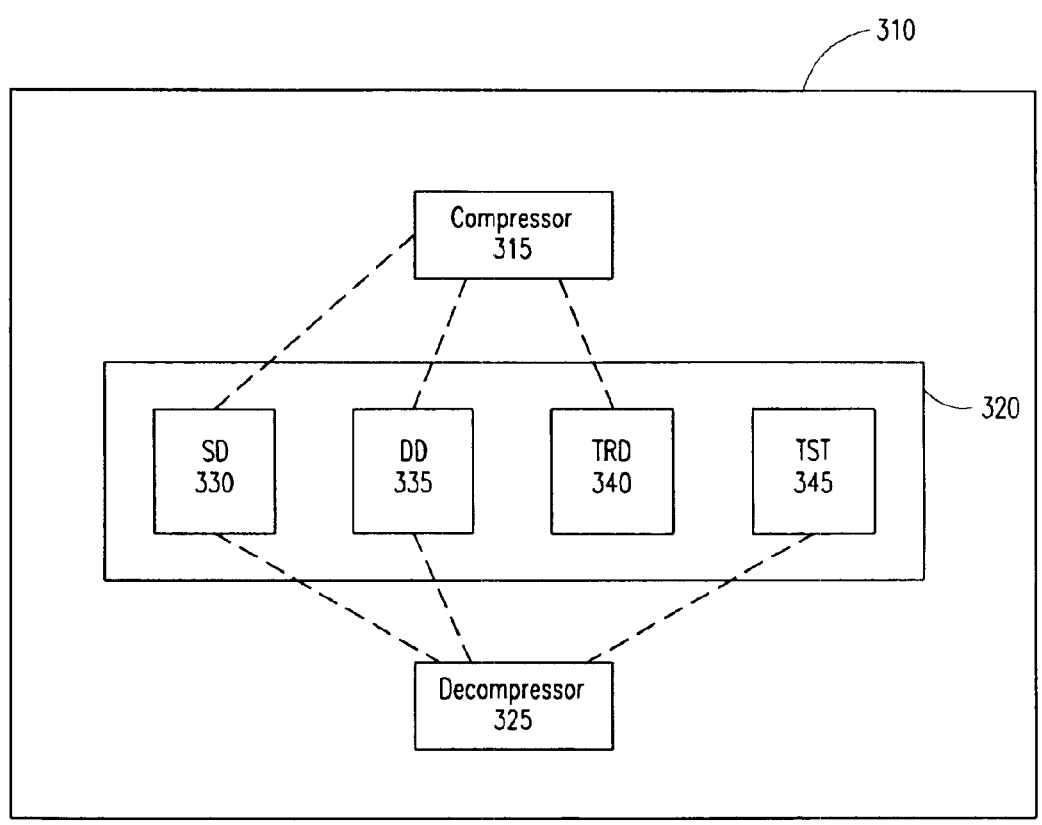
FIG. 3 illustrates an exemplary communication entity in accordance with the present invention.

With reference now to FIG. 3 of the Drawings, there is illustrated an exemplary communication entity in accordance with the present invention. The exemplary communication entity 310, such as may be used in entity A (210) and entity B (230) of FIG. 2, contains a compressor 315 to compress transmitted messages, a decompressor 325 to decompress received messages, and a number of dictionaries/tables (generally designated by the reference numeral 320). The dictionaries/tables 320 are used by the communication entity 310 for compression and decompression of messages using a binary compression method, such as a dictionary compression method. In accordance with the present invention, the dictionary/tables 320 include a static dictionary (SD) 330, a dynamic dictionary (DD) 335, a Temporary Receiver Dictionary (TRD) 340, and a Temporary Sender Table (TST) 345.

Static dictionary (SD) 330 is a predefined compression/decompression dictionary which is known by both the compressor and the decompressor at each communication entity (210,230). The static dictionary is constructed before compression occurs and does not change during the current or a subsequent compression process. The static dictionary may be stored in the communication entity prior to use, or transmitted and stored in the entity prior to the start of a communication session. The static dictionary may contain messages or parts of messages, i.e., strings, which may occur in a communication message or packet during communication sessions. It is not required that entire messages be stored in the static dictionary. It should be understood that it may be desirable to store only parts or strings of messages which would be useful for compression.

Dynamic dictionary (DD) 335 is a dynamic dictionary which contains messages or parts of messages that are known by both the compressor and decompressor of each communication entity. The dynamic dictionary (DD) 335 is updated during a communication session according to the teachings of the present invention, and used as a dictionary for subsequent compression and decompression operations. In accordance with the present invention and illustrated further hereinbelow, the dynamic dictionary (DD) 335 may be updated by moving entries from the Temporary Receiver Dictionary (TRD) 340 or the Temporary Sender Table (TST) 345 to the dynamic dictionary (DD) 335.

Temporary Receiver Dictionary (TRD) 340 is a temporary dictionary which contains messages or parts of messages which have traversed the communication link. Messages in the Temporary Receiver Dictionary (TRD) are also used for the compression of messages. An indication of the message or string is transmitted from the transmitting entity to the receiving entity to indicate that the message has been used by the compressor. This indication may be included in the header of the message packet to be sent.

Finally, the Temporary Sender Table (TST) 345 is a temporary table containing messages or parts of messages which will be sent over the link that have been judged to be useful for future dictionary usage.

When a communication entity 310 performs a compression operation, the compressor 315 uses the static dictionary (SD) 330, dynamic dictionary (DD) 335, and Temporary Receiver Dictionary (TRD) 340 as compression dictionaries to compress the current message. If messages stored in the Temporary Receiver Dictionary (TRD) 340 are used in the compression process, an indication is included in the header of the communication packet to indicate to the receiving dictionary which TRD messages are being used.

When a communication entity 310 performs a decompression operation, the decompressor 325 uses the static dictionary (SD) 330, dynamic dictionary (DD) 335, and Temporary Sender Table (TST) 345 as decompression dictionaries to decompress the current received message. However, the entries in the Temporary Sender Table (TST) are only used if the header of the packet which is to be decompressed indicates that a message stored in the TST at the receiving entity has been used to compress the message at the transmitting entity.

The searching order of the dictionaries and tables is determined by the particular communication method or standard implemented, so that the compressor and decompressor do not refer to different dictionaries or tables. When a particular match is found, a search for a longer match may still be performed depending on the particular compression algorithm used. For example, for a Lempel-Ziv compression algorithm, the search may be limited by the length of the look-ahead buffer.

Figure 4:
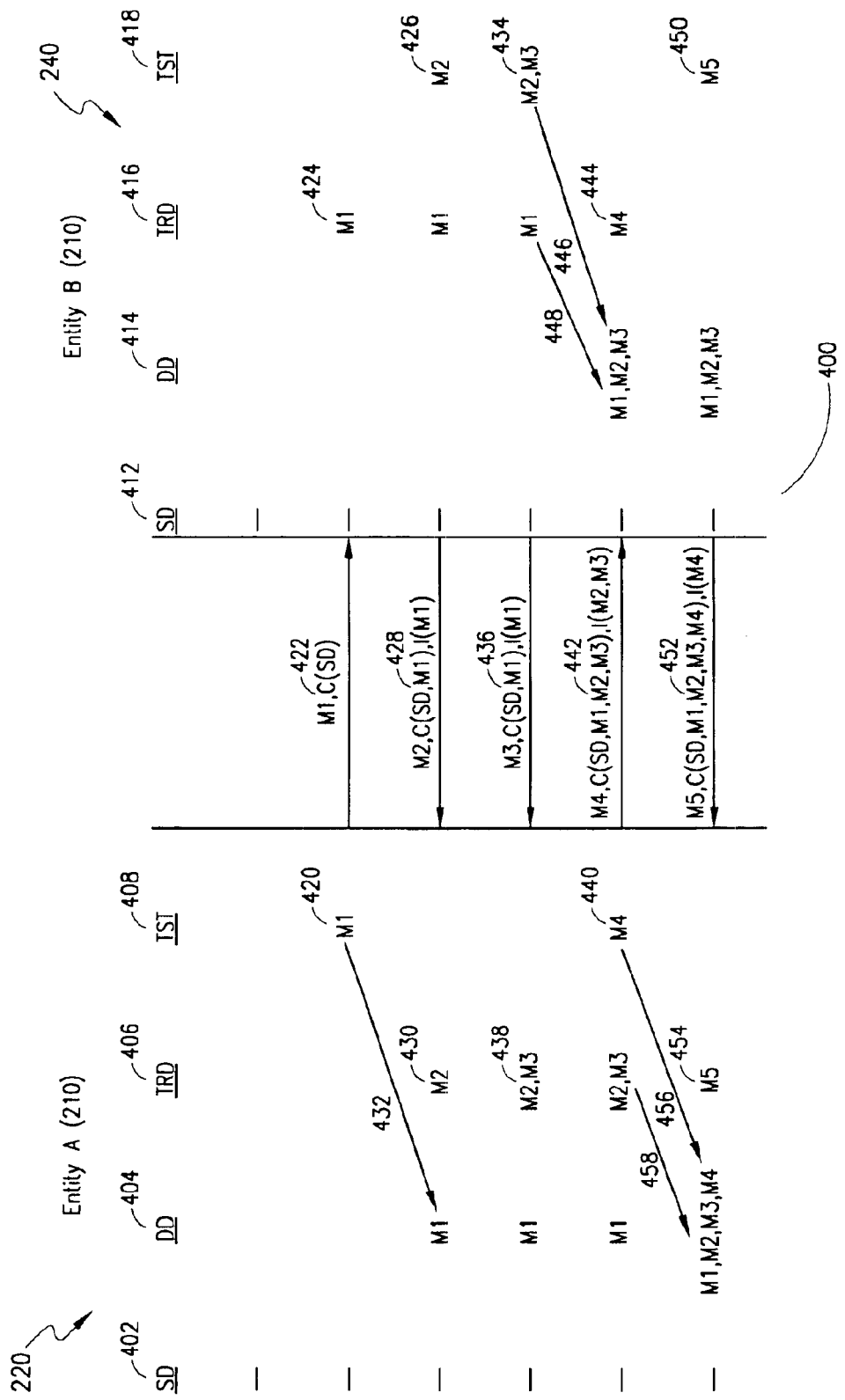
FIG. 4 illustrates an exemplary method of data compression in accordance with the present invention.

FIG. 4 illustrates an exemplary method of data compression in accordance with the present invention, generally designated by the reference numeral 400. In the exemplary illustration of FIG. 4, an entity A (210) and an entity B (230), which can constitute the aforedescribed mobile terminal 110 and base station 120, respectively, communicate using compressed messages over communication links (250,255) through the use of a communication protocol. Entity A (210) contains compression and decompression dictionaries/tables 220, which include a static dictionary (SD) 402, a dynamic dictionary (DD) 404, a Temporary Receiver Dictionary (TRD) 406, and a Temporary Sender Table (TST) 408.

Similarly, entity B (230) contains compression and decompression dictionaries/tables 240, which include a static dictionary (SD) 412, a dynamic dictionary (DD) 414, a Temporary Receiver Dictionary (TRD) 416, and a Temporary Sender Table (TST) 418.

In the exemplary illustration of FIG. 4, flow arrows indicate the flow of messages M1–M5 between entity A (210) and entity B (230) during an exemplary communication session. Columns SD (402), DD (404), TRD (406), and TST (408) of entity A (210), and columns SD (412), DD (414), TRD (416), and TST (418) of entity B (230), indicate the contents of the respective dictionaries and tables at given instances during the communication session. The notation Mn corresponds to a particular message, or part of a message, number n. The notation of C(SD,M1, . . . ) indicates the dictionary compression of the current message by the sending entity using dictionaries or tables containing the static dictionary (SD) and message M1, etc. It should be understood that the respective decompression in the receiving entity will be performed using the same static dictionary and messages. The notation I(Mn) represents the transmission of identification information in the header of the compressed message indicating that a particular message Mn in the Temporary Receiver Dictionary (TRD) has been used during compression.

As previously described, when a communication entity performs a compression operation, the compressor of the entity uses its respective static dictionary (SD), dynamic dictionary (DD), and Temporary Receiver Dictionary as compression dictionaries to compress the current message.

As also previously described, when a communication entity performs a decompression operation, the decompressor of the entity uses its respective static dictionary (SD), dynamic dictionary (DD), and Temporary Sender Table (TST) as decompression dictionaries to decompress the current received message. However, the entries in the Temporary Sender Table (TST) are only used if the header of the packet which is to be decompressed includes identification information that a message stored in the TST at the receiving entity has been used to compress the message at the transmitting entity.

Prior to the start of a communication session, entity A (210) and entity B (230) begin with identical static dictionaries (SD) (402,412) for use by the respective compressors (215,245) and decompressors (225,235) of each entity. Entity A prepares to send a first message, M1, to entity B by first compressing M1 using static dictionary (SD) 402 and storing M1 in Temporary Sender Table (TST) 408 (step 420). Compressed message M1 and a M1 message ID are then transmitted to Entity B (230) (step 422). After reception of the compressed message M1 by entity B (230), entity B (230) decompresses the compressed message and stores M1 in its Temporary Receiver Dictionary (TRD) 416 (step 424). An indication of M1, I(M1), will now be included in every message sent by entity B (230) until it receives an indication from entity A (210) that a message which carried the M1 indication was received by entity A.

Further in illustration of the exemplary method of FIG. 4, entity B (230) prepares to send a second message, M2, to entity A (210). Entity B compresses M2, using dictionaries containing SD and M1, and stores M2 in its Temporary Sender Table (TST) 418 (step 426). The compressed message M2, an M2 message ID, and an indication of M1, I(M1), are then transmitted by entity B (230) to entity A (210) (step 428). After reception of the compressed message M2 by entity A (210), entity A (210) decompresses the compressed message and stores M2 in its Temporary Receiver Dictionary (TRD) 406 (step 430). Entity A (210) then moves M1 from its TST (408) to its dynamic dictionary (DD) 404 (step 432).

It should be understood that a strict request-reply order of communication between entities is not required for the use of the exemplary method in accordance with the present invention. As further illustrated in the exemplary method of FIG. 4, entity B (230) prepares to send a third message, M3, to entity A (210). Entity B compresses M3, using dictionaries containing SD and M1, and stores M3 in its Temporary Sender Table (TST) 418 (step 434). The compressed message M3, an M3 message ID, and an indication of M1, I(M1), are then transmitted by entity B (230) to entity A (210) (step 436). After reception of the compressed message M3 by entity A (210), entity A (210) decompresses the compressed message and stores M3 in its Temporary Receiver Dictionary (TRD) 406 (step 438). Since, entity A (210) has already moved M1 from its TST 408 to its DD 404 in step 432, it is not necessary to perform this step again.

Further in illustration of the exemplary method of FIG. 4, entity A (210) prepares to send a fourth message, M4, to Entity B (230). Entity A compresses M4, using dictionaries containing SD, M1, M2, and M3, and stores M4 in its Temporary Sender Table (TST) 408 (step 440). The compressed message M4, an M4 message ID, and an indication of M2 and M3, I(M2,M3), are then transmitted by entity A (210) to entity B (230) (step 442). After reception of the compressed message M4 by entity B (230), entity B (230) decompresses the compressed message and stores M4 in its Temporary Receiver Dictionary (TRD) 416 (step 444). Entity B (230) then moves M2 and M3 from its TST (418) to its dynamic dictionary (DD) 414 (step 446). Entity B (230) also moves M1 to its DD (step 448) because M1 was indicated in the M2 message communication and thus both entity A (210) and entity B (230) are aware of M1. As a result, M1 no longer needs to be indicated in messages sent from entity B (230).

Further in illustration of the exemplary method of FIG. 4, entity B (230) prepares to send a fifth message, M5, to entity A (210). Entity B compresses M5, using dictionaries containing SD, M1, M2, M3, and M4, and stores M5 in its Temporary Sender Table (TST) 418 (step 450). The compressed message M5, an M5 message ID, and an indication of M4, I(M4), are then transmitted by entity B (230) to entity A (210) (step 452). After reception of the compressed message M5 by entity A (210), entity A (210) decompresses the compressed message and stores M5 in its Temporary Receiver Dictionary (TRD) 406 (step 454). Entity A (210) then moves M4 from its TST (408) to its dynamic dictionary (DD) 404 (step 456). Entity A (210) also moves M2 and M3 to its DD (step 458) because M2 and M3 were indicated in the M4 message communication and thus both entity A (210) and entity B (230) are aware of M2 and M3. As a result, M2 and M3 no longer need to be indicated in messages from entity A (210).

Figure 5:
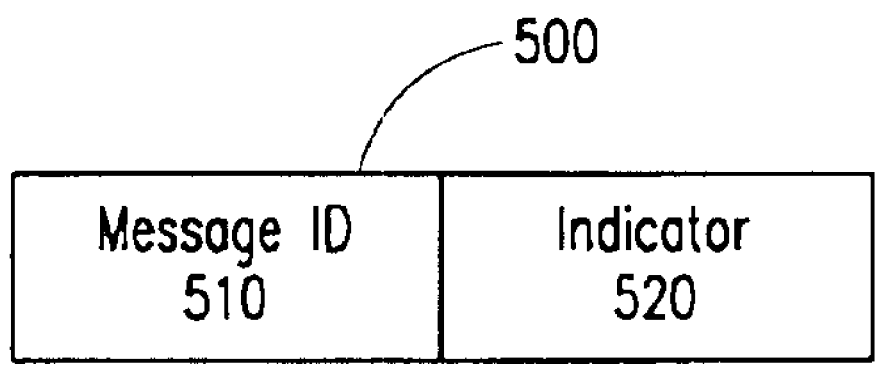
FIG. 5 illustrates an exemplary message header in accordance with the present invention.

FIG. 5 illustrates an exemplary message header in accordance with the present invention, generally designated by the reference numeral 500. In accordance with the present invention, a message identification (ID) number 510 and an indication 520 to indicate TRD messages used by the compressor, are transmitted as a message header 500 along with the compressed message. In this exemplary embodiment the message header 500 is not placed in the Temporary Receiver Dictionary (TRD), i.e., it is not used to compress packets during a communication session. In an exemplary message header according to the present invention, the message ID number (510) may consist of four bits and the message indication (520) may consist of a twelve bit bit-mask. The four bit message ID allows for sixteen message numbers while the twelve bit bit-mask allows for the indication of twelve received messages. The remaining four code points may be used for the indication of other information in the message header (500).

It should be understood that whole messages need not be stored in the static dictionaries, dynamic dictionaries, Temporary Receiver Dictionaries, or Temporary Sender Tables of the present invention. Alternately, only parts of messages that are deemed useful for compression need be stored. For example, for a Lempel-Ziv or other dictionary compression method, only strings which are not previously in the dictionary or table may be added. This will provide the benefit of keeping the need for memory and processing power to a minimum.

It should also be understood that any or all of the dictionaries or tables of the present invention may be replaced by a binary code tree. For example, the static dictionary may be replaced by a static binary code tree and/or the dynamic dictionary replaced by a dynamic code tree. It should also be understood that the static dictionary may be omitted from the present invention.

One benefit of the system, method, and apparatus of the present invention provides for the efficient compression of messages and updating of compression and decompression dictionaries during communication sessions using data protocols. The bidirectional nature of the communication protocol is used to quickly update the compression and decompression dictionaries in each of the communication entities by allowing previous messages to be used in the compression process.

The system, method, and apparatus of the present invention also produces an improvement in robustness of the use of compressed communication messages. The message ID and indication information in messages sent from the compressor is used by the decompressor to indicate whether a message has been correctly received, thus preventing lost messages to be used for updating compression dictionaries.

Although various embodiments of the method, system, and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the scope of the invention as set forth and defined by the following claims.

What is claimed is:

1. A method for compressed message communication by a communication entity, said method comprising the steps of:

compressing a first communication message, using first compression information from any of at least one dictionary and a receiver dictionary, to generate a first compressed communication message;

storing second compression information related to said compressing of said first communication message in a sender table;

transmitting said first compressed communication message to another communication entity;

receiving a second compressed communication message from said another communication entity; and transferring said second compression information from said sender table to said at least one dictionary.

2. The method of claim 1, wherein said step of transferring said second compression information from said sender table to said at least one dictionary is conditional upon the reception of an indication signal from said another communication entity indicating that said first compressed communication message was received thereby.

3. The method of claim 1, wherein said step of transferring said second compression information from said sender table to said at least one dictionary is conditional upon said second compression information not currently residing within said at least one dictionary.

4. The method of claim 1, wherein said second compression information comprises a portion of said first communication message.

5. The method of claim 1, said method further comprising the step of: decompressing said second compressed communication message using third compression information from any of said at least one dictionary and said sender table.

6. The method of claim 5, said method further comprising the step of: storing fourth compression information, related to said decompressing of said second compressed communication message, in said receiver dictionary.

7. A method for compressed message communication by a communication entity, said method comprising the steps of:

receiving a compressed communication message from another communication entity; decompressing said compressed communication message using first compression information from any of at least one dictionary and a sender table, to generate a first communication message;

storing second compression information, related to said decompressing of said first compressed communication message, in a receiver dictionary;

sending a second communication message to said another communication entity;

receiving a third communication message from said another communication entity; and following reception of said third communication message, transferring said second compression information from said receiver dictionary to said at least one dictionary.

8. The method of claim 7, wherein said second communication message comprises an acknowledgment of said receiving of said compressed communication message from said another communication entity.

9. The method of claim 7, wherein said third communication message comprises an implicit acknowledgment of the reception of said second communication message by said another communication entity.

10. The method of claim 7, wherein said second compression information comprises a portion of said first communication message.

11. The method of claim 7, wherein said second communication message comprises an indication message, said indication message indicating compression information stored in said receiver dictionary corresponding to one or more compressed messages previously received by said communication entity.

* * * * *